United States Patent
Chmielewski et al.

(10) Patent No.: US 7,235,973 B2
(45) Date of Patent: Jun. 26, 2007

(54) PHASED ARRAY COILS UTILIZING SELECTABLE QUADRATURE COMBINATION

(75) Inventors: Thomas Chmielewski, Willoughby Hills, OH (US); Shmaryu Shvartsman, Highland Heights, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/553,175

(22) PCT Filed: Apr. 2, 2004

(86) PCT No.: PCT/IB2004/001146
§ 371 (c)(1),
(2), (4) Date: Oct. 14, 2005

(87) PCT Pub. No.: WO2004/092760
PCT Pub. Date: Oct. 28, 2004

(65) Prior Publication Data
US 2006/0226840 A1    Oct. 12, 2006

Related U.S. Application Data

(60) Provisional application No. 60/463,639, filed on Apr. 18, 2003.

(51) Int. Cl.
*G01V 3/00*    (2006.01)

(52) U.S. Cl. .................................. 324/318; 324/309

(58) Field of Classification Search ........ 324/300–322; 600/410, 422
See application file for complete search history.

(56) References Cited

U.S. PATENT DOCUMENTS

| 4,918,388 | A | | 4/1990 | Mehdizadeh et al. |
| 5,030,915 | A | * | 7/1991 | Boskamp et al. ........... 324/318 |
| 5,144,243 | A | | 9/1992 | Nakabayashi et al. |
| 5,394,087 | A | * | 2/1995 | Molyneaux ................. 324/318 |
| 5,471,142 | A | | 11/1995 | Wang |
| 5,578,925 | A | | 11/1996 | Molyneaux et al. |
| 5,621,323 | A | * | 4/1997 | Larsen ....................... 324/318 |

(Continued)

FOREIGN PATENT DOCUMENTS

| EP | 1 146 348 A2 | 10/2001 |
| WO | WO 89/05115 A1 | 6/1989 |

OTHER PUBLICATIONS

Fayad, Z.A., et al.; An Improved Quadrature or Phased-Array Coil for MR Cardiac Imaging; 1995; MR in Medicine; 34:186-193.

*Primary Examiner*—Brij Shrivastav
(74) *Attorney, Agent, or Firm*—Thomas M. Lundin

(57) ABSTRACT

A magnetic resonance imaging apparatus includes a main magnet (12) for generating a main magnetic field in an examination region (14), a plurality of gradient coils (22) for setting up magnetic field gradients in the main field, an RF transmit coil for transmitting RF signals into the examination region to excite magnetic resonance in a subject disposed therein, and an RF receive coil (16) for receiving RF signals from the subject. The RF receive coil includes a first loop (101) and a second loop (102), the first and second loops being disposed substantially in a similar plane (x-z). Also included is a signal combiner (120) for combining the signals received by the first and second loops in quadrature.

20 Claims, 5 Drawing Sheets

U.S. PATENT DOCUMENTS 6,169,401 B1     1/2001    Fujita et al.
6,377,044 B1     4/2002    Burl et al.
6,639,406 B1 *  10/2003    Boskamp et al. ........... 324/318
6,870,453 B2 *   3/2005    Schulz et al. ............... 335/216
2002/0089329 A1  7/2002    Harvey et al.

* cited by examiner

PHASED ARRAY COILS UTILIZING SELECTABLE QUADRATURE COMBINATION

CROSS REFERENCE TO RELATED APPLICATIONS

This application claims the benefit of U.S. provisional application Ser. No. 60/463,639 filed Apr. 18, 2003, which is incorporated herein by reference.

The present invention relates to the magnetic resonance arts. It finds particular application in conjunction with medical diagnostic imaging and will be described with reference thereto. It is to be appreciated, however, that the invention may find further application in quality control inspections, spectroscopy, and the like.

In early Magnetic Resonance Image (MRI) scanners, resonance signals were received by placing linearly polarized radio frequency (RF) coils adjacent to the surface of a patient. The linearly polarized coils received only one component of magnetic resonance signals, commonly, the component in either the horizontal or vertical direction. By contrast, the magnetic resonance signals emanating from the subject are more accurately defined by a vector which rotates in a plane, i.e. has two orthogonal components. Thus, the linearly polarized coil only received one of the two orthogonal components.

A quadrature coil, which has a circularly polarized magnetic field, receives orthogonal components of the rotating vector. A quadrature coil can support both the horizontal and vertical made current distributions. Thus, the quadrature coil extracts twice the signal from the rotating vector than does the linearly polarized coil. This results in a signal-to-noise ratio which is greater by the square root of two or about 41%. However, prior art quadrature coils are commonly volume coils rather than surface coils. For example, some volume quadrature coils have included two saddle coils which were rotated 90 degrees relative to each other. The portion of the patient to be imaged is disposed within the volume defined in the interior of the saddle coils. Analogously, other coils have been utilized which define a volume around the circularly polarized region.

The desirability of a quadrature surface or flat coil for applications such as spine imaging has, accordingly, been recognized. See, for example, U.S. Pat. No. 4,918,388 of Mehdizadeh, et al. The Mehdizadeh surface coil includes a thin dielectric sheet having a first or loop coil defined on one surface thereof and a second or Helmholtz coil defined on an obverse surface thereof. The first and second coils are arranged symmetrically about an axis or plane of symmetry. The first coil has an associated magnetic field along a y-axis and the second coil has an associated magnetic field along the x-axis.

Due to the coil disclosed in U.S. Pat. No. 4,918,388, having first and second coils arranged symmetrically about an axis or plane of symmetry, spatial intensity separation is not readily achievable. This limits the use of such a coil in applications such as SENSE.

The present invention contemplates a new, improved RF coil which overcomes the above difficulties and others.

Those skilled in the art will, upon reading and understanding the appended description, appreciate that aspects of the present invention address the above and other matters.

In accordance with one aspect of the invention, a magnetic resonance imaging apparatus is provided. The magnetic resonance imaging apparatus includes a main magnet for generating a main magnetic field in an examination region, a plurality of gradient coils for setting up magnetic field gradients in the main field, an RF transmit coil for transmitting RF signals into the examination region to excite magnetic resonance in a subject disposed therein, an RF receive coil for receiving RF signals from the subject, the RF receive coil including a first loop and a second loop, the first and second loops being disposed substantially in a similar plane, and a signal combiner for combining the signals received by the first and second loops in a quadrature mode.

In accordance with a more limited aspect of the invention, geometric centers of the first and second loops are displaced with respect to one another in a direction perpendicular to the main magnetic field.

In accordance with a more limited aspect of the invention, the first and second loops are overlapped to reduce mutual inductance between the loops.

In accordance with a more limited aspect of the invention, the RF signals received by the first and second loops have components in first and second directions, the first and second directions being perpendicular to the main magnetic field.

In accordance with a more limited aspect of the invention, the signal combiner combines the RF signals associated with the first and second loops in the first direction by adding said signals phase shifted one-hundred eighty degrees with respect to one another and the signal combiner combines the RF signals associated with the first and second loops in the second direction by adding said signals in phase.

In accordance with a more limited aspect of the invention, the magnetic resonance imaging apparatus further includes switching means for switching the signal combiner from quadrature mode to a phased array mode.

In accordance with a more limited aspect of the invention, the first and second loops have similar geometries with respect to one another.

In accordance with another aspect of the invention, a magnetic resonance imaging apparatus is provided. The magnetic resonance imaging apparatus includes a main magnet for generating a main magnetic field in an examination region, an RF transmit coil positioned about the examination region such that it excites magnetic resonance in dipoles disposed therein, an RF transmitter for driving the RF transmit coil, an RF receive coil for receiving magnetic resonance signals from the resonating dipoles, the RF receive coil including a plurality of loop coils, the plurality of loop coils being disposed in non-orthogonal planes with respect to one another, and a signal combiner for combining the signals received by the plurality of loop coils selectively in a quadrature combination mode or a phased array mode.

In accordance with a more limited aspect of the invention, the RF receive coil includes an n×m array of loop coils extending perpendicularly to the main magnetic field and in a direction parallel to the main magnetic field.

In accordance with a more limited aspect of the invention, the plurality of loop coils have similar geometries with respect to one another.

In accordance with a more limited aspect of the invention, the R-F signals received by the plurality of loop coils have components in first and second directions, the first and second directions being perpendicular to the main magnetic field.

In accordance with a more limited aspect of the invention, the signal combiner combines the RF signals associated with at least a first and second loop of the plurality loop coils in the first direction by adding said signals phase shifted one-hundred eighty degrees with respect to one another and the signal combiner combines the RF signals associated with the first and second loops in the second direction by adding said signals in phase.

In accordance with a more limited aspect of the invention, the magnetic resonance imaging apparatus further includes switching means for switching the signal combiner from quadrature mode to phased array mode.

In accordance with another aspect of the invention, a magnetic resonance RF coil assembly is provided. The RF coil assembly includes, a first loop, the first loop being disposed in a first plane, a second loop, the second loop being disposed in a second plane; the first and second planes being non-orthogonal, and a signal combiner for quadrature combining RF signals associated with the first loop with RF signals associated with the second loop.

In accordance with a more limited aspect of the invention, the first and second loops are disposed adjacent to one another in substantially the same plane.

In accordance with a more limited aspect of the invention, the RF coil assembly further includes means for reducing mutual inductance between the loops.

In accordance with a more limited aspect of the invention, the first and second loops are both sensitive to RF signals having components in first and second directions, the first and second directions being orthogonal to one another.

In accordance with a more limited aspect of the invention, the signal combiner combines RF signals associated with the first and second loops in the first direction by adding said signals phase shifted one-hundred eighty degrees with respect to one another and the signal combiner combines RF signals associated with the first and second loops in the second direction by adding said signals in phase.

In accordance with a more limited aspect of the invention, the RF coil assembly further includes switching means for switching the signal combiner from quadrature mode to a phased array mode.

In accordance with a more limited aspect of the invention, the first and second loops have similar geometries with respect to one another.

One advantage of the invention resides in a planar array that has spatial intensity discrimination.

Another advantage of the invention is that the coils in the array can be quadrature combined.

Another advantage of the invention is that outputs of the coils in the array can be taken separately as a phased array.

Another advantage of the present invention resides in an RF coil structure which facilitates manufacture of the coil.

Still further advantages of the present invention will become apparent to those of ordinary skill in the art upon a reading and understanding of the following description of the preferred embodiments.

The invention may take form in various components and arrangements of components, and in various steps and arrangements of steps. The drawings are only for purposes of illustrating a preferred embodiment and are not to be construed as limiting the invention.

Figure 1:
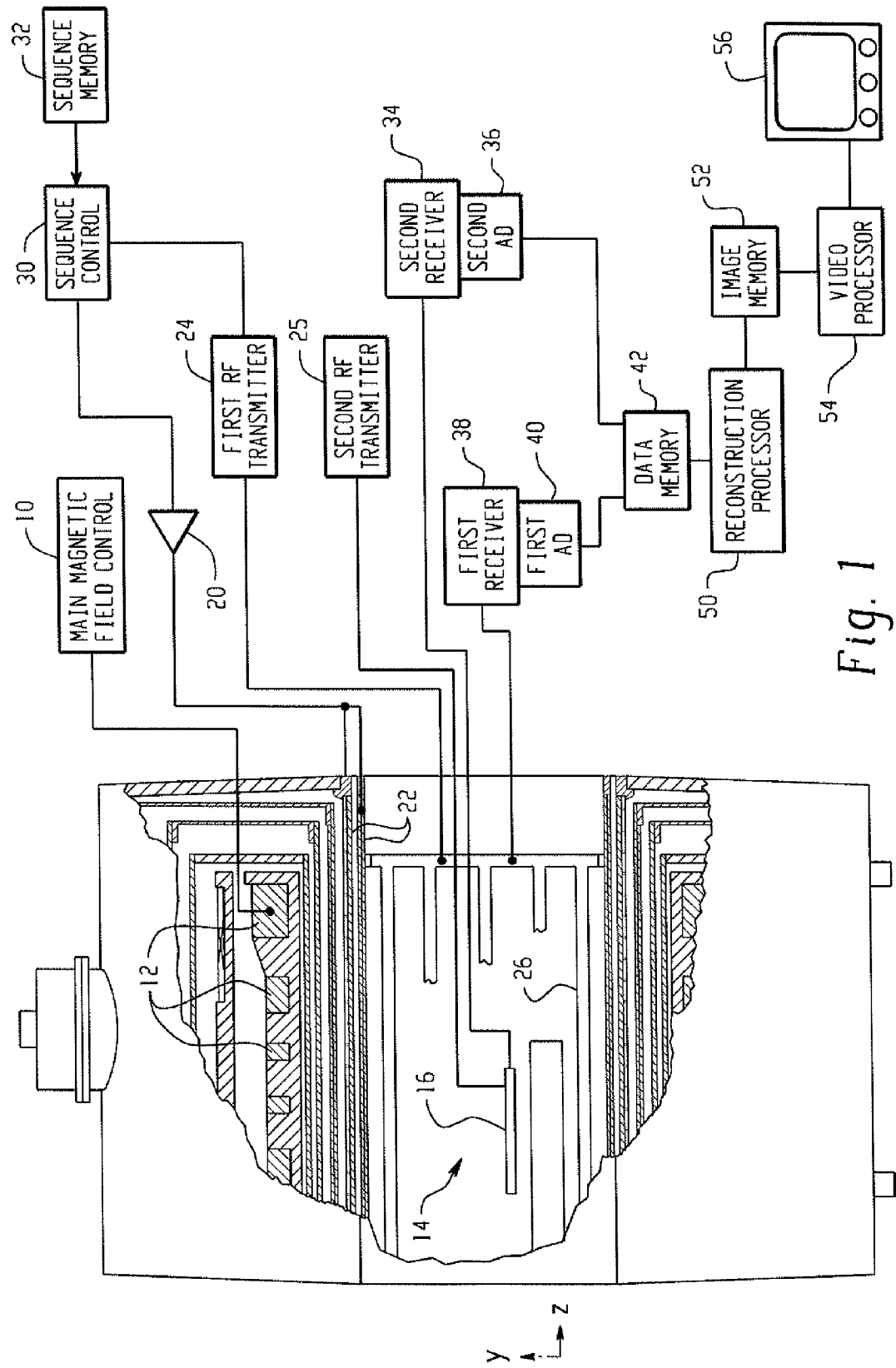
FIG. 1 is an illustration of a magnetic resonance imaging apparatus in accordance with the present invention.

With reference to FIG. 1, an MRI scanner is depicted. A main magnetic field control 10 controls a main magnetic field magnet 12 such as a superconducting or resistive magnet. The main magnet 12 is controlled to generate a substantially uniform, steady main magnetic field, $B_0$, having a desired strength (e.g., 1.5 Tesla) in an examination zone or region 14 in which an object to be examined is arranged. As shown, the examination zone 14 takes the shape of a cylindrical bore, however other shapes as well as open field examination zones are contemplated. Typically, $B_0$ is set up in the direction of a z axis which is the central longitudinal axis of the examination zone 14.

Pulse sequences are stored in a sequence memory 32 and are carried out by sequence control 30. The sequence control 30 controls a gradient pulse amplifier 20 and first and second RF transmitters 24, 25 as necessary. More specifically, the sequence control 30 controls the gradient pulse amplifiers 20 and the transmitters to produce a plurality of MRI pulse sequences that generate and gradient encode (i.e., slice, phase, and/or frequency encode) the MR signals that are ultimately received and sampled.

Gradient pulse amplifiers 20 apply current pulses to selected gradient coils 22 to create magnetic field gradients along orthogonal axes of the examination region 14. These magnetic fields extend substantially in the same direction as $B_0$ but have gradients in the x, y and/or z directions, respectively.

A digital radio frequency transmitter 24 transmits radio frequency pulses or pulse packets to a first RF coil 26, which is, for example, a whole-body birdcage RF coil, to transmit RF pulses into the examination region. A typical radio frequency pulse is composed of a packet of immediately contiguous pulse segments of short duration which taken together with each other and any applied gradients achieve a selected magnetic resonance manipulation. These RF pulses set up a $B_1$ magnetic field in the examination zone 14, at a Larmor frequency that is determined by the strength of the magnetic field and the gyromagnetic constant of the magnetic dipole species of interest. This frequency is typically approximately 63.8 MHz for a magnetic field having a strength of 1.5 Tesla. The RF pulses are used to saturate, excite resonance, invert magnetization, refocus resonance, or otherwise manipulate resonance in selected portions of the examination region.

A second RF coil assembly 16 is disposed in the examination region and is optionally controlled by a second RF transmitter 25 to selectively produce RF pulses in the examination region 14. As shown in FIG. 1, the second RF coil 16 is a surface coil array. As with the first RF coil 26, these RF pulses set up a $B_1$ magnetic field in the examination zone.

Regardless of which RF transmitter is used, a typical RF pulse is composed of a packet of immediately contiguous pulse segments of short duration, which taken together with each other and any applied gradients, achieve the selected magnetic resonance manipulation. The MRI pulse sequences employed optionally generate MR signals for either two-dimensional (2D) or three-dimensional (3D) imaging. The MRI pulse sequences employed optionally include any of a plurality of single echo or multi-echo imaging sequences. Imaging may be carried out using any number of known MRI techniques, e.g., field echo (FE) imaging, spin echo (SE) imaging, echo planar imaging (EPI), echo volume imaging, gradient and spin echo (GSE) imaging, fast spin echo (FSE) imaging, single shot FSE imaging, three-dimension volume FSE imaging, parallel imaging techniques (e.g., sensitivity encoding (SENSE), simultaneous acquisition of spatial harmonics (SMASH), etc.), and/or the like. In the case of 2D imaging, the region of interest represents a 2D cross-sectional slice through the object being imaged. In the case of 3D imaging, the region of interest represents a 3D volume of the subject being imaged.

Magnetic resonance signals arising from the examination region 14 are received by an RF receive coil disposed in proximity to the examination region. The RF receive coil can optionally be the body RF coil 26 or the local RF coil 16. A first receiver 38 receives magnetic resonance signals from the whole body RF coil 26 and demodulates the signals into a plurality of data lines. If the receiver is analog, a first analog-to-digital converter 40 converts each data line to a digital format. Alternately, the analog-to-digital converter is disposed between the radio frequency receiving coil 26 and the receiver 38 for digital receivers.

A second receiver 34 receives magnetic resonance signals from the local RF coil assembly 16 and demodulates the signals into a plurality of lines of data. If the receiver 34 is analog, a local analog to digital converter 40 converts each data line from the local receiver into digital format. Again, the analog to digital converter can be upstream from a digital receiver. Data lines from the receiver(s) 38, 34 are arranged and stored in a data memory 42.

Alternately, the local RF coil 16 and its associated transmit and receive hardware may be the only RF transmit/receive hardware in the system.

It is to be understood that the local coil 16 is subdivided into a number of sections or loops, each of which is can be connected to the second receiver 34. Accordingly, the second receiver 34 may include a number of receivers and associated analog to digital converters, for example, one for each section of the local coil 16. Alternately, a single multi-channel receiver can be employed. Another embodiment includes a single channel receiver for receiving combined signals from the local coil sections.

The data lines are reconstructed into an image representation by a reconstruction processor 50 which applies an inverse Fourier transform or other appropriate reconstruction algorithm. The image may represent a planar slice through the patient, an array of parallel planar slices, a three-dimensional volume, or the like. The electronic image representation is then stored in an image memory 52 where it is selectively accessed by a video processor 54 that converts slices, projections, or other portions of the image representation into appropriate format for a display, such as a monitor 56 which provides a human-readable display of the resultant image.

Figure 2:
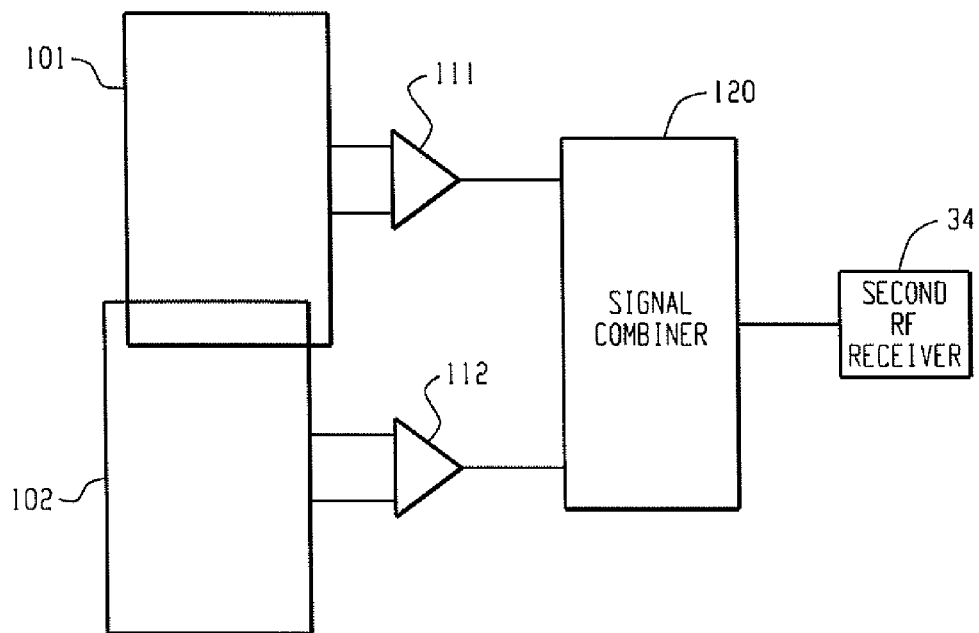
FIG. 2 is an illustration of a local RF coil assembly having two loop coils.

With reference to FIG. 2, the local coil assembly 16, includes a first loop coil 101 and a second loop coil 102. In one embodiment, the first and second loop coils lie substantially in the same plane, for example the x-z plane, and are overlapped to reduce the effects of mutual inductance between the coils. It is to be understood, however, that other methods of reducing mutual inductance, such as, inductive decoupling where the loops are not necessarily overlapped. In the embodiment shown, the centers of the coil loops are displaced from one another in the x-direction. The displacement in the z-direction is shown only for the purposes of clarity. As shown in FIG. 2, both loop coils are rectangular in shape, but it is to be understood that other shaped coils are contemplated. It is also to be understood that the local coil includes tuning capacitors and transmit decouplers that are known in the art. These elements are not shown here for the sake of simplicity.

Continuing with FIG. 2, the first loop coil 101 is electrically connected to a first preamplifier 111. The second loop coil 102 is electrically connected to a second preamplifier 112. Outputs from the first and second preamps 111, 112 serve as inputs to a signal combiner 120. The signal combiner 120 is connected to the second RF receiver 34.

Figure 3:
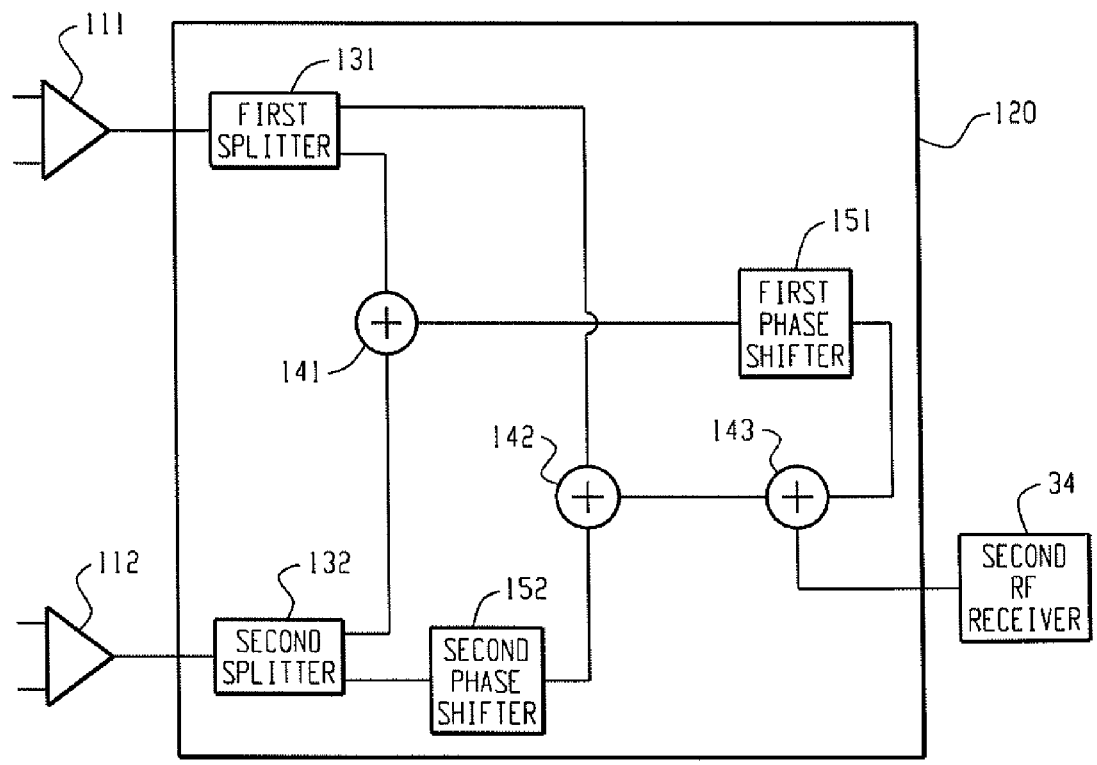
FIG. 3 is diagram of a signal combiner.

FIG. 3 shows an embodiment of the signal combiner 120. As can be seen, the signal combiner 120 includes a first splitter 131, the input of which comes from the first preamplifier 111. The first splitter 131 has two outputs. A first output is connected to a first adder 141, and a second output is connected to a second adder 142. The first adder 141 is connected to a first phase shifter 151. In the embodiment shown, the phase shifter is a ninety-degree phase shifter. The first phase shifter 151 is connected to a third adder 143.

Continuing with FIG. 3, the signal combiner 120 also includes a second splitter 132, the input of which comes from the second preamplifier 112. The second splitter 132 has two outputs. A first output is connected to the first adder 141 and a second output is connected to second phase shifter 152. In the embodiment shown, the second phase shifter is a one-hundred eighty degree phase shifter. The second phase shifter is connected to the second adder 142 and provides input thereto. Along with the first phase shifter, the output from the second adder 142 is connected to the third adder 143. The output from the third adder 143 is connected to the second RF receiver 34.

Figure 4:
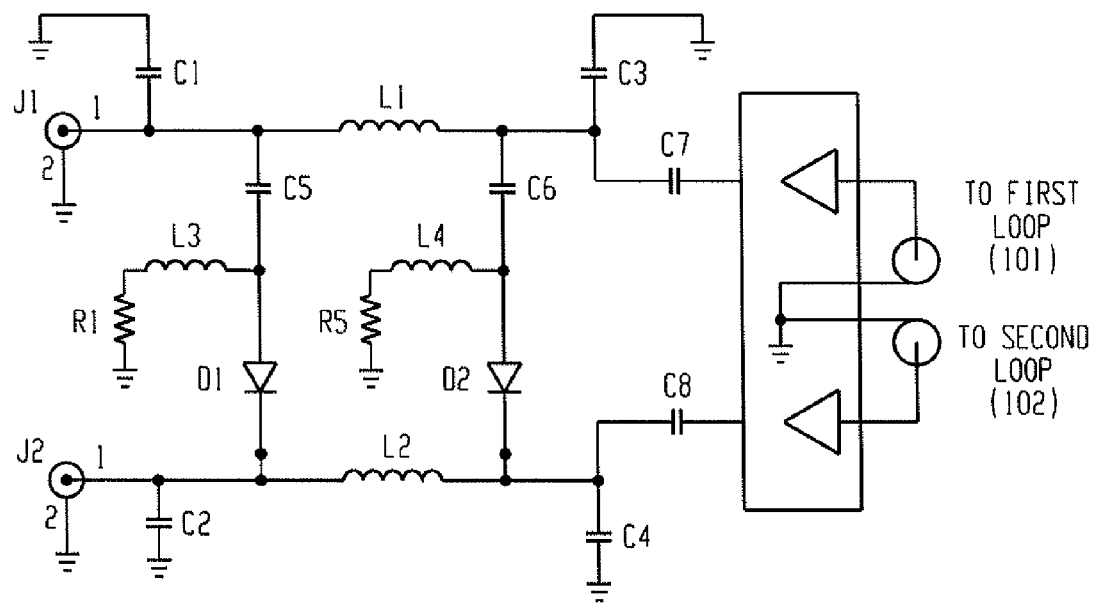
FIG. 4 is a circuit diagram of a quadrature combiner.

In an alternate embodiment, the signal combiner 120 can be a quadrature combiner as is known to one of ordinary skill in the art. FIG. 4 shows a circuit diagram of such a quadrature combiner. As is known in the art, combiner capacitors C1, C2, C3, C4, C5, C6 and inductors L1, L2 make up the quadrature combiner when combiner diodes D1, D2 are biased on. When the diodes are biased on, the local RF coil assemble 16 acts as a quadrature coil. When the diodes D1, D2 are biased off, capacitors C1, C2 and inductor L1 and capacitors C3, C4 and inductor L2 make up fifty ohm transmission lines. In this latter mode of operation, the local RF coil assembly 16 serves as a phased-array coil.

In operation, a main magnetic field $B_0$ is generated in the examination region 14 and a subject is placed therein. A series of RF and magnetic field gradient pulses are applied to invert or excite magnetic spins, induce magnetic resonance, refocus magnetic resonance, manipulate magnetic resonance, spatially and otherwise encode the magnetic resonance, to saturate spins, and the like to generate MRI pulse sequences. More specifically, the gradient pulse amplifiers 20 apply current pulses to selected ones or pairs of the gradient coils 22 to create magnetic field gradients along x, y, and z axes of the examination region 14. The whole body RF transmitter 24 drives the whole body RF transmit coil 26 to transmit RF pulses or pulse packets into the examination region 14. Alternately, the local RF transmitter 25 similarly drives the local RF coil 16 to transmit RF pulses or pulse packets into the examination region 14.

Regardless of the MRI pulse sequence or technique employed, the sequence control 30 coordinates the plurality of MRI pulse sequences that generate the MR signals that are ultimately received from the examination region. For the selected sequence, each echo of the received MR signal is received by the first RF coil 26 or the local RF coil 16.

In the case where the local RF coil 16 serves to receive the signals from the examination region, the local coil can operate in two modes of operation. In the first mode, the local RF coil 16 serves as a quadrature coil. With reference to the embodiment shown in FIGS. 2 and 3, the RF signals received by the first and second loop coils 101, 102 from the examination region are transmitted to first and second preamplifiers 111, 112 respectively where they are amplified for further processing.

The amplified signals are then transmitted to the signal combiner 120 where RF signals in the vertical mode (y-direction) and in the horizontal mode (x-direction) are quadrature combined. Generally speaking, with reference to FIG. 5, the sensitivity of each loop 101, 102 has components in the x- and y-directions. With respect to FIG. 5, for the sake of clarity, the loops 101, 102 are shown in cross section without any overlap. The vertical mode Y is obtained by adding the preamplifier outputs of the first and second preamplifiers in phase. The horizontal mode X is obtained by adding the preamplifier output from the first loop 101 to the preamplifier output of the second loop 102 shifted by one-hundred eighty degrees.

More particularly, and with reference again to FIG. 3, the vertical mode Y is obtained by transmitting the RF signal ($S_A$) from the first preamplifier 111 and the RF signal ($S_B$) from the second preamplifier 112 to the signal combiner 120. The RF signals $S_A$ and $S_B$ are split by first and second splitters 131, 132 respectively. As is known in the art, this results in two output signals from the each splitter equal to $0.7S_A$ for the first splitter and $0.7S_B$ for the second splitter.

In order to obtain the vertical mode, the first outputs from each splitter are added, in phase, by the first adder 141. This results in a signal $S_Y$ equal to $0.7S_A+0.7S_B$.

In order to obtain the horizontal mode, the second output from the second splitter 132 is phase shifted by the second phase shifter 152. In the embodiment shown, the phase shift is one-hundred eighty degrees. Accordingly, the second phase shifter 152 outputs a signal equal to $-0.7S_B$. This signal is then added to the second output of the first splitter 131 by the second adder 142. This results in a signal $S_X$ equal to $0.7S_A-0.7S_B$.

In order to combine the horizontal and vertical signals $S_X$, $S_Y$ in quadrature, vertical signal $S_Y$ is phase shifted by the first phase shifter 151. In the embodiment shown, $S_Y$ is phase shifted by ninety degrees. This results in a signal equal to $j(0.7S_A+0.7S_B)$. This signal is added to the horizontal signal $S_X$ by the third adder 143. This results in a signal:

$$S_{QUAD}=(0.7S_A-0.7S_B)+j(0.7S_A+0.7S_B) \quad (1)$$

which can be rewritten as:

$$S_{QUAD}=S_A(45 \text{ degrees})+S_B(135 \text{ degrees}) \quad (2)$$

Since in the embodiment shown the $S_B$ component lags the $S_A$ component by ninety degrees, a standard quadrature combiner, as shown schematically in FIG. 4, can be implemented as the signal combiner.

As stated above, the local RF coil 16 can operate in two modes of operation. In the first mode, the local RF coil 16 serves as a quadrature coil. In the second mode, the local RF coil serves as a phased array coil. In this mode of operation, the signal combiner 120 is switched such that two separate signals corresponding to first and second loop coils 101, 102 are transmitted separately to individual receive channels. Such an embodiment allows for parallel processing applications such as SENSE.

Figure 5:
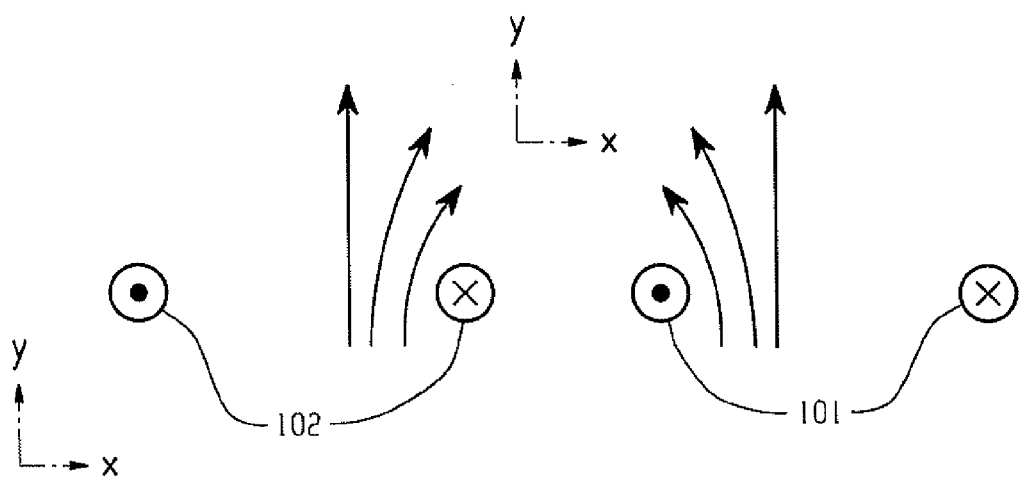
FIG. 5 is an illustration of magnetic field sensitivity patterns of two loop coils shown in cross section.

In the phased-array embodiment, the combiner circuitry shown in FIG. 5 can be used as the signal combiner 120. Here, the quadrature combiner can be switched in or out depending on the DC bias present at a second port J2. If the phased-array mode is desired, a positive bias is applied. The PIN diodes D1 and D2 are switched off, and the first and second loop signals are available at first and second ports J1 and J2. If the quadrature combination is desired, a negative bias is applied at the second port J2. This will result in a quadrature signal at one of the ports J1 or J2 depending on field orientations. The anti-quadrature signal will be present at the other port.

Regardless of which coil serves as the RF receive coil, or in which mode the local coil assembly 16 operates, the received MR signal is sampled a plurality of times by the associated RF receiver 38, 36 and analog to digital converter 40, 36, resulting in data lines or arrays of sampled data points representing each echo. This raw MR data is then loaded into the MR data memory or buffer 42. The MR data memory represents the data matrix commonly know as k-space. Based upon the particular gradient encoding imparted to each echo, the corresponding MR data is mapped to or otherwise assigned a location in k-space.

The data are reconstructed into an image representation by a reconstruction processor 50 which applies an inverse Fourier transform or other appropriate reconstruction algorithm. The electronic image representation is then stored in an image memory 52 where it is selectively accessed by a video processor 54 that converts slices, projections, or other portions of the image representation into appropriate format for a display, such as a monitor 56 which provides a human-readable display of the resultant image.

The coil 16 has been described on the basis of an embodiment involving two loop coils. However, various-sized arrays are contemplated. For example, it is also possible to have a spine coil having two 5-loop arrays placed side-by-side for what amounts to being a 2 by 5 coil array extending lengthwise in the z-direction. In such an embodiment the loop arrays are overlapped to provide isolation for each pair. The diagonal neighbor isolation is achieved through capacitive cancellation in a common diagonal conductor. The next nearest neighbor isolations are inherent due to separation. With reference to the spine array example, each level of the spine coil has two loops whose preamplifier outputs can be taken separately or in quadrature combination as described above.

In another embodiment, the local coil includes an n×m array where n is a multiple of two in the x-direction and m is in the z-direction (or magnetic field direction). Such an array can be quadrature combined into nm/2 signals.

Figure 6:
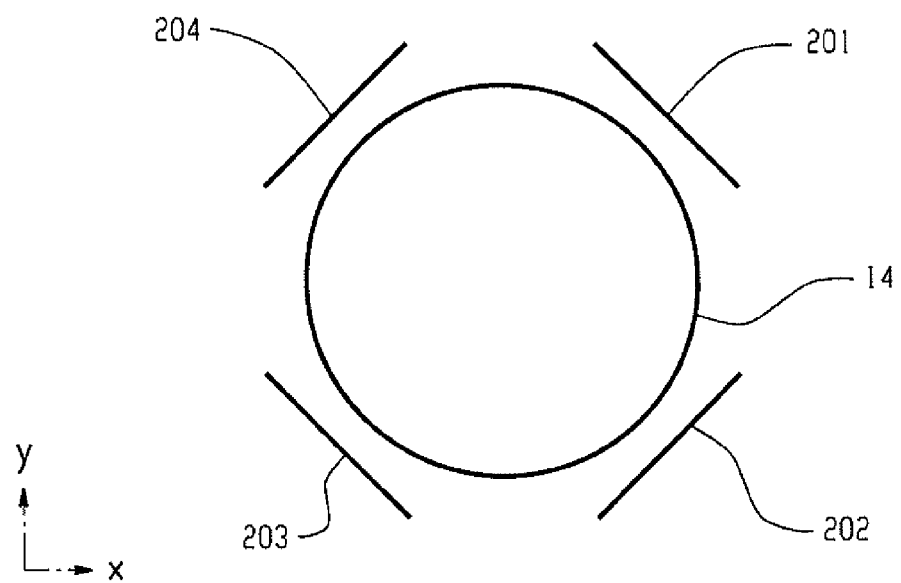
FIG. 6 is an illustration showing a coil array spaced around an examination region.

In yet another embodiment, first, second, third, and fourth loop coils 201, 202, 203, and 204 are spaced around the examination region as shown in FIG. 6. The coils are isolated from one another using known isolation techniques. In this embodiment, the coils can be selectively combined for sensitivity encoding along the horizontal (x-direction) or in the vertical (y-direction).

For sensitivity encoding in the x-direction, the first 201 and second 202 loop coils can be quadrature combined and the third 203 and fourth 204 can be quadrature combined. This results in a pair of quadrature coils with sensitivity encode capabilities in the x-direction as shown in FIG. 6. For sensitivity encoding in the y-direction, the second and third coils can be quadrature combined and the first and fourth coils can be quadrature combined. This results in a pair of quadrature coils with sensitivity encoding capabilities in the y-direction as shown in FIG. 6.

Figure 7:
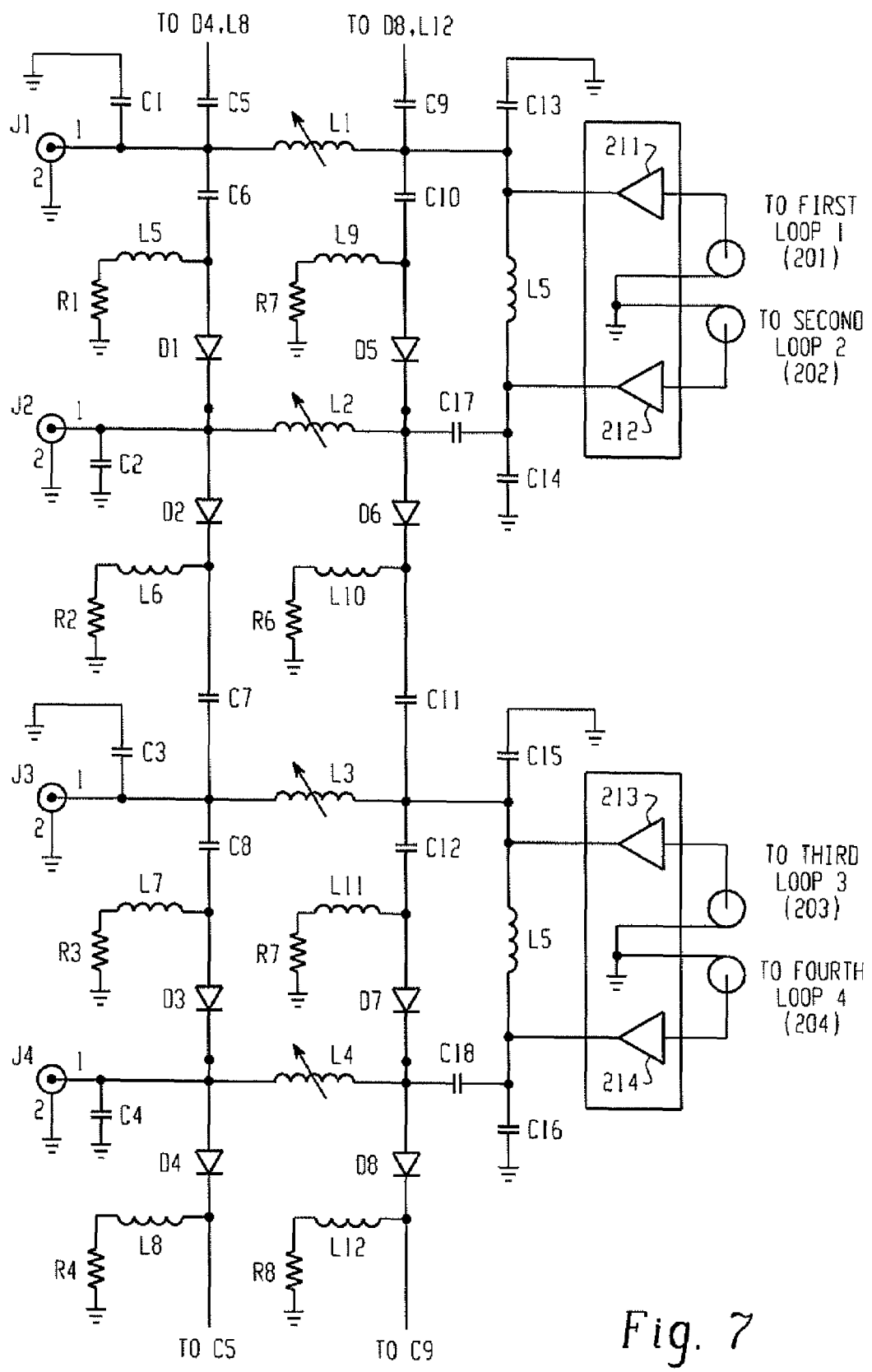
FIG. 7 is a circuit diagram of a four channel selectable quadrature combiner.

FIG. 7 shows how the configuration of coils shown in FIG. 6 can selectively be used as a four-coil phased array coil or as pairs of quadrature coils as described above. More specifically, FIG. 7 shows a four channel selectable quadrature combiner that allows for the combination of the first, second, third, and fourth coils 201, 202, 203, 204 into two quadrature receive channels. The combiner can select spatial discrimination in either x- or y-directions as desired.

In this embodiment, signals are taken from each loop 201, 202, 203, 204 and are fed to first, second, third, and fourth preamplifiers 211, 212, 213, 214, respectively. The amplified signals are fed to the signal combiner 230, at first, second, third, and fourth combiner inputs 221, 222, 223, 224, respectively. The circuitry of the signal combiner 230 shown in FIG. 7 includes PIN diode switches D1 . . . D8 which serve to switch the coils between quadrature modes and the phased array mode. Capacitors C1 . . . C16 and inductors L1 . . . L4 make up quadrature combiners. Inductors L5 . . . L14 serve as DC bypass inductors and resistors R1 . . . R8 are current limiting resistors for switching bias.

Placing a negative DC bias at ports J2 and J4 biases PIN diodes D1, D3, D5 and D7 on. This serves to quadrature combine the first and second loop coils and the third and fourth loop coils for spatial discrimination in the x-direction. The quadrature signal will appear at ports J1 and J3 or J2 and J4 depending on the $B_0$ field polarity.

Placing a positive bias at ports J2 and J4 biases PIN diodes D2, D4, D6 and D8 on. This serves to quadrature combine first and fourth coils and second and third coils for spatial discrimination in the y-direction.

Placing a zero volt DC bias at J2 and J4 turns off all of the PIN diodes. Here, no quadrature combination occurs and separate phased array signals can be taken from all four coils.

The invention has been described with reference to the preferred embodiment. Obviously, modifications and alterations will occur to others upon reading and understanding the preceding description. It is intended that the invention be construed as including all such modifications and alterations insofar as they come within the scope of the appended claims or the equivalents thereof.

The invention claimed is:

1. A magnetic resonance imaging apparatus comprising:
a main magnet for generating a main magnetic field in an examination region;
a plurality of gradient coils for setting up magnetic field gradients in the main field;
an RF transmit coil for transmitting RF signals into the examination region to excite magnetic resonance in a subject disposed therein;
an RF receive coil for receiving RF signals from the subject, the RF receive coil including a first loop and a second loop, the first and second loops being disposed substantially in a similar plane; and
a signal combiner for combining the signals received by the first and second loops in a quadrature mode.

2. A magnetic resonance imaging apparatus as set forth in claim 1 wherein geometric centers of the first and second loops are displaced with respect to one another in a direction perpendicular to the main magnetic field.

3. A magnetic resonance imaging apparatus as set forth in claim 2 wherein the first and second loops are overlapped to reduce mutual inductance between the loops.

4. A magnetic resonance imaging apparatus as set forth in claim 1 wherein the RF signals received by the first and second loops have components in first and second directions, the first and second directions being perpendicular to the main magnetic field.

5. A magnetic resonance imaging apparatus as set forth in claim 4 wherein the signal combiner combines the RF signals associated with the first and second loops in the first direction by adding said signals phase shifted one-hundred eighty degrees with respect to one another and the signal combiner combines the RF signals associated with the first and second loops in the second direction by adding said signals in phase.

6. A magnetic resonance imaging apparatus as set forth in claim 1 further comprising switching means for switching the signal combiner from quadrature mode to a phased array mode.

7. A magnetic resonance imaging apparatus as set forth in claim 1 wherein the first and second loops have similar geometries with respect to one another.

8. A magnetic resonance imaging apparatus comprising:
a main magnet for generating a main magnetic field in an examination region;
an RF transmit coil positioned about the examination region such that it excites magnetic resonance in dipoles disposed therein;
an RF transmitter for driving the RF transmit coil;
an RF receive coil for receiving magnetic resonance signals from the resonating dipoles, the RF receive coil including a plurality of loop coils, the plurality of loop coils being disposed in non-orthogonal planes with respect to one another; and
a signal combiner for combining the signals received by the plurality of loop coils selectively in a quadrature combination mode or a phased array mode.

9. A magnetic resonance imaging apparatus as set forth in claim 8 wherein the RF receive coil includes an n×m array of loop coils extending perpendicularly to the main magnetic field and in a direction parallel to the main magnetic field.

10. A magnetic resonance imaging apparatus as set forth in claim 8 wherein the plurality of loop coils have similar geometries with respect to one another.

11. A magnetic resonance imaging apparatus as set forth in claim 8 wherein the RF signals received by the plurality of loop coils have components in first and second directions, the first and second directions being perpendicular to the main magnetic field.

12. A magnetic resonance imaging apparatus as set forth in claim 11 wherein the signal combiner combines the RF signals associated with at least a first and second loop of the plurality loop coils in the first direction by adding said signals phase shifted one-hundred eighty degrees with respect to one another and the signal combiner combines the RF signals associated with the first and second loops in the second direction by adding said signals in phase.

13. A magnetic resonance imaging apparatus as set forth in claim 8 further comprising switching means for switching the signal combiner from quadrature mode to phased array mode.

14. A magnetic resonance RF coil assembly comprising:
a first loop, the first loop being disposed in a first plane;
a second loop, the second loop being disposed in a second plane; the first and second planes being non-orthogonal; and
a signal combiner for quadrature combining RF signals associated with the first loop with RF signals associated with the second loop.

15. A magnetic resonance RF coil assembly as set forth in claim 14 wherein the first and second loops are disposed adjacent to one another in substantially the same plane.

16. A magnetic resonance RF coil assembly as set forth in claim 15 further comprising means for reducing mutual inductance between the loops.

17. A magnetic resonance RF coil assembly as set forth in claim 14 wherein the first and second loops are both sensitive to RF signals having components in first and second directions, the first and second directions being orthogonal to one another.

18. A magnetic resonance RF coil assembly as set forth in claim 17 wherein the signal combiner combines RF signals associated with the first and second loops in the first direction by adding said signals phase shifted one-hundred eighty degrees with respect to one another and the signal combiner combines RF signals associated with the first and second loops in the second direction by adding said signals in phase.

19. A magnetic resonance RF coil assembly as set forth in claim 14 further comprising switching means for switching the signal combiner from quadrature mode to a phased array mode.

20. A magnetic resonance RF coil assembly as set forth in claim 14 wherein the first and second loops have similar geometries with respect to one another.

* * * * *